United States Patent [19]

Menniti et al.

[11] 3,938,053
[45] Feb. 10, 1976

[54] INTEGRATED CIRCUIT FOR CLASS-B POWER AMPLIFIER

[75] Inventors: Pietro Menniti; Bruno Murari, both of Milan, Italy

[73] Assignee: SGS-ATES Componenti Elettronici SpA, Milan, Italy

[22] Filed: Sept. 19, 1974

[21] Appl. No.: 507,464

[30] Foreign Application Priority Data
Sept. 20, 1973   Italy .................................. 29148/73

[52] U.S. Cl. ...................... 330/17; 330/18; 330/19; 330/22; 330/38 M
[51] Int. Cl.² ......................................... H03F 3/187
[58] Field of Search .......... 330/17, 18, 19, 22, 38 M

[56] References Cited
UNITED STATES PATENTS

| | | | |
|---|---|---|---|
| 3,509,364 | 4/1970 | Buckley | 330/17 X |
| 3,611,170 | 10/1971 | Wheatley | 330/17 X |

OTHER PUBLICATIONS
*Electronic Design 4* Vol. 21, No. 4, Feb. 15, 1973 p. A9.

*Primary Examiner*—James B. Mullins
*Attorney, Agent, or Firm*—Karl F. Ross; Herbert Dubno

[57] ABSTRACT

A Class-B power amplifier, designed as a monolithically integrated circuit, comprises in its final stage an NPN output transistor Q4 whose base is driven by an NPN control transistor Q3 through the intermediary of a pair of current-replicating PNP transistors Q6, Q7 with interconnected bases having their emitters tied to the collector of the output transistor. Their common base lead, also tied to the collector of the replicating transistor Q6 to connect same as a diode, is joined to the collector of control transistor Q3; the collector of the second replicating transistor Q7 is joined to base of the output transistor Q4. An alternating signal is fed to the base of a PNP input transistor Q1 lying in series with a NPN pilot transistor Q2, the collectors of the two latter transistors being tied to the base of the control transistor Q3 whose emitter is connected to a load terminal jointly with the emitter of the output transistor Q4. On negative half-cycles of the signal to be amplified, the second replicating transistor Q7 saturates before the input transistor Q1 to maximize the output voltage on the load terminal.

10 Claims, 3 Drawing Figures

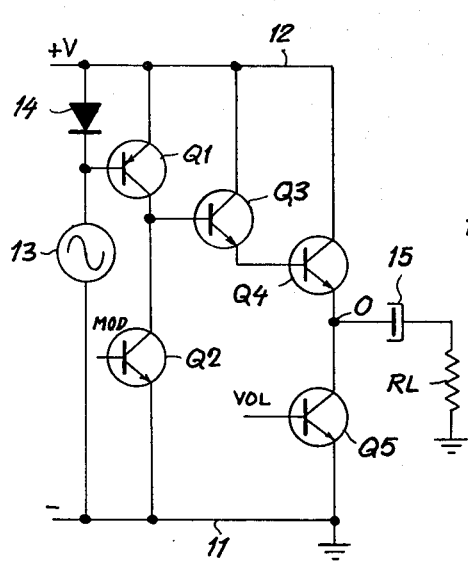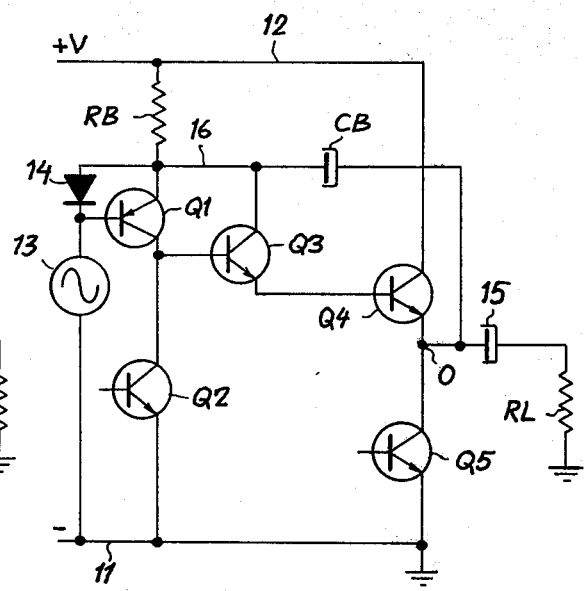
FIG. 1A  PRIOR ART  FIG. 1B
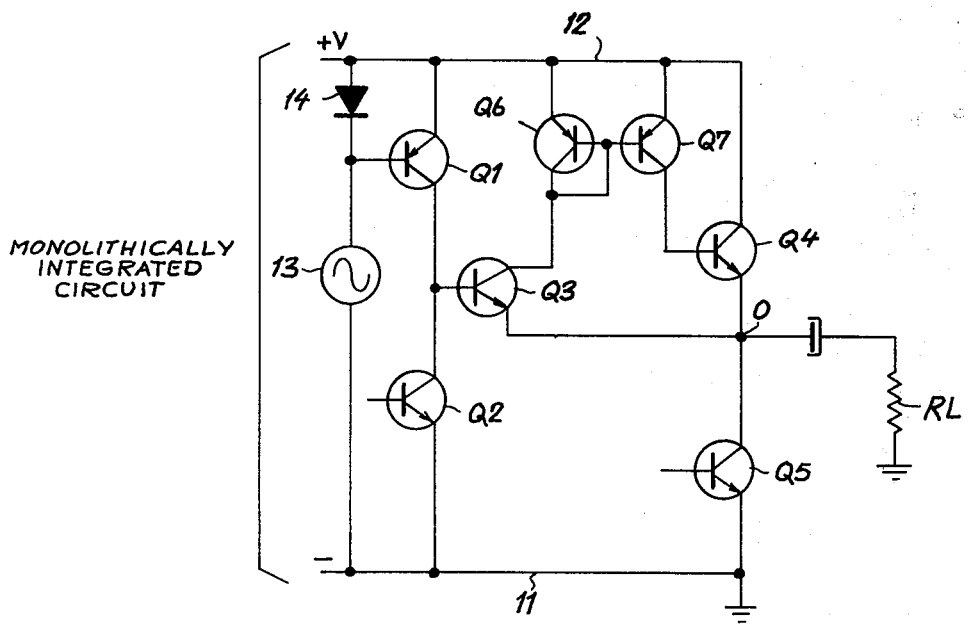
FIG. 2

INTEGRATED CIRCUIT FOR CLASS-B POWER AMPLIFIER

FIELD OF THE INVENTION

Our present invention relates to a power amplifier of Class B type, i.e. an amplifier for unipolar signals or for alternate half-cycles of a balanced oscillation such as a carrier wave.

BACKGROUND OF THE INVENTION

Conventional power amplifiers of this Class comprise several cascaded transistor stages, i.e. an input transistor driven by the signal to be amplified, a control transistor having its base connected to the collector of the input transistor, and an output transistor whose base is tied to the emitter of the control transistor. The emitter of the input transistor, whose conductivity type (e.g. PNP) is opposite that of the other two transistors, is connected to a bus bar of a d-c power supply in parallel with the collectors of the control and output transistors. The peak of the output voltage, occurring upon saturation of the input transistor, falls short of the supply potential by the sum of the saturation voltage drop across the input transistor and the base/emitter voltages of the control and output transistors.

In order to reduce the loss in signal strength represented by this voltage difference, it has already been proposed to separate the emitter of the input transistor and the collector of the control transistor from the associated supply bus bar by a resistor of a magnitude substantially greater than that of a load resistance energized by the output transistor and to feed back the emitter potential of the output transistor through a coupling condenser to the emitter of the input transistor. Such a system, known as a bootstrap circuit, drives the output transistor to saturation at the signal peaks but requires the use of a large capacitor (usually of the electrolytic type) in the feedback path and also causes the dissipation of energy in the isolating resistor. This system is therefore difficult or impossible to realize with a monolithic integrated circuit.

OBJECT OF THE INVENTION

The object of our invention is to provide an improved power amplifier of the type discussed which, while not quite attaining the high voltage ratio of a bootstrap circuit, significantly reduces the voltage loss of the first-mentioned type of power amplifier while being realizable as an integrated monolithic module.

SUMMARY OF THE INVENTION

This object is realized, pursuant to our present invention, by the provision of an ancillary transistor whose conductivity type is opposite that of the control and output transistors, this ancillary transistor having its emitter connected to a high-voltage supply bus bar (which also energizes the collector of the output transistor) and having its base connected to the collector of the control transistor; a diode connected in forward direction between that bus bar and the base of the ancillary transistor produces in the input thereof a small voltage drop proportional to the collector current of the control transistor so as substantially to replicate this collector current in the output of the ancillary transistor whose collector is tied to the base of the output transistor. Since the replicated collector current of the control transistor reaches the base of the output transistor directly from the supply bus bar through the emitter/collector path of the ancillary transistor, the difference between the supply potential and the peak output voltage is the sum of the saturation voltage drop of the ancillary transistor and the base/emitter voltage of the output transistor.

According to a more particular feature of our invention, the faithful replication of the collector current of the control transistor at the collector of the ancillary transistor is insured by designing the aforementioned diode as an image transistor of the same conductivity type and substantially the same operating characteristics as the ancillary transistor but with its collector directly connected to its base, these two transistors being paired with their bases as well as their emitters interconnected.

Since in our improved power amplifier the peak of the output voltage is achieved with saturation of the ancillary or second replicating transistor rather than the input transistor, it is desirable to select the circuit parameters in such a way that the ancillary transistor saturates within the operating range of the input transistor which therefore goes into saturation only after the ancillary transistor. In fact, the provision of such an input transistor as a source of driving current for the control transistor is not essential though this is convenient in practice since the collector of that input transistor, tied to the base of the control transistor, may be returned to the other (usually grounded) bus bar of the d-c power supply through a variable impedance such as a pilot transistor for the purpose of facilitating modulation of the basic signal fed to the base of the input transistor. The interconnected emitters of the control and output transistors may be similarly returned to that other bus bar through an adjustable impedance, preferably in the form of a switching transistor, enabling the load current to be turned on and off or otherwise adjusted.

BRIEF DESCRIPTION OF THE DRAWING

The above and other features of our invention will now be described in detail with reference to the accompanying drawing in which:

FIGS. 1A and 1B are circuit diagrams of conventional power amplifiers of the type referred to above; and FIG. 2 is a similar circuit diagram illustrating our present improvement.

SPECIFIC DESCRIPTION

The conventional power amplifier of FIG. 1A comprises a d-c supply with a grounded first bus bar 11 and a positive second bus bar 12. A signal source 13, such as a carrier-wave oscillator, is connected between these two bus bars in series with a diode 14 whose anode is connected to bus bar 12 along with the emitter of an input transistor Q1 and the collectors of a control transistor Q3 and of an output transistor Q4. The base of input transistor Q1 is tied to the cathode of diode 14, at its junction with signal source 13, whereas its collector is connected to the base of transistor Q3 and also to the collector of a pilot transistor Q2 whose emitter is grounded and which therefore lies in series with input transistor Q1 between bus bars 11 and 12. The base of pilot transistor Q2 may receive a modulating signal for the amplitude of the carrier delivered by oscillator 13.

The emitter of control transistor Q3 works into the base of output transistor Q4 whose emitter is connected to a load terminal 0 and is grounded through a switching transistor Q5 whose collector is tied to the same load terminal and whose emitter is joined to bus bar 11. A volume-controlling or on-off signal may be applied to the base of transistor Q5. A load circuit lying between terminal 0 and ground is shown to include a capacitor 15 in series with resistor RL. With the exception of input transistor Q1, which is of PNP type, all the transistors shown in FIG. 1A are of NPN type.

As will be readily apparent, the saturation of input transistor Q1 by a highly negative signal voltage from oscillator 13 will generate on load terminal 0 a peak voltage differing from supply voltage +V by a value $V_{ce}(Q1\text{sat}) + V_{be}(Q3) + V_{be}(Q4)$ where the first term is the saturation collector/emitter voltage of input transistor Q1, the second term is the base/emitter voltage of control transistor Q3 and the third term is the base/emitter voltage of output transistor Q4.

FIG. 1B shows a conventional power amplifier of the bootstrap type which differs from that of FIG. 1A by the insertion of a large isolating resistor RB, substantially greater than load resistance RL, between bus bar 12 and an ancillary bus bar 16 to which the anode of diode 14, the emitter of input transistor Q1 and the collector of control transistor Q3 are connected. A large coupling condenser CB links the bus bar 16 with the load terminal 0.

In the system of FIG. 1B the maximum voltage on load terminal 0 is reached when the output transistor Q4 is driven to saturation, this voltage then differing from the supply voltage +V merely by the saturation voltage $V_{ce}(Q4\text{sat})$ of transistor Q4.

Reference will now be made to FIG. 2 which shows our improved Class-B power amplifier embodied in a monolithic integrated circuit. Transistors Q1 – Q5 of FIGS. 1A and 1B are here supplemented by a pair of current-replicating transistors Q6 and Q7 both of the PNP type. Transistors Q6 and Q7 are substantially identical and represent the above-discussed image and ancillary transistors, respectively. Both these transistors have their emitters tied to bus bar 12 and their bases connected to the collector of control transistor Q3 which is also joined to the collector of image transistor Q6 whereby the latter transistor functions as a diode with a forward resistance in the input circuit of ancillary transistor Q7. As explained above, the collector current of transistor Q7 is virtually a replica of the collector current of transistor Q3. The output voltage on terminal 0 reaches its peak on saturation of transistor Q7 so that its maximum value differs from supply voltage +V by $V_{be}(Q4) + V_{ce}(Q7\text{sat})$, the first term having the same significance as above whereas the second one denotes the collector/emitter voltage of the saturated transistor Q7.

For reasons already explained, transistor Q7 should go to saturation on negative values of the input signal from source 13 insufficient to saturate the transistor Q1.

We claim:

1. A power amplifier comprising:
   a supply of direct current with a first bus bar and a second bus bar of opposite polarities;
   a source of signals to be amplified;
   a control transistor of one conductivity type having a base, a collector and an emitter;
   an output transistor of said one conductivity type having a base, a collector and an emitter, the emitter of said control transistor being tied to that of said output transistor;
   an output impedance inserted between said first bus bar and the interconnected emitters of said control and output transistors;
   input circuitry connecting said source between said first bus bar and the base of said control transistor;
   a diode connected in forward direction between said second bus bar and the collector of said control transistor;
   an ancillary transistor of opposite conductivity type having an emitter connected to said second bus bar, a base connected to the collector of said control transistor, and a collector connected to the base of said output transistor for delivering to said output transistor a driving current substantially replicating the collector current of said control transistor; and
   a load circuit connected across said output impedance.

2. A power amplifier as defined in claim 1 wherein said diode comprises an image transistor of said opposite conductivity type and of substantially the same operating characteristics as said ancillary transistor, said image transistor having an emitter connected to said second bus bar, a base connected to the base of said ancillary transistor, and a collector connected to the collector of said control transistor, the interconnected collectors of said control and image transistors being tied to the interconnected bases of said image and ancillary transistors.

3. A power amplifier as defined in claim 2 wherein said input circuitry comprises an input impedance connected directly to said second bus bar and through said source to said first bus bar; a coupling impedance tied to said first bus bar; and an input transistor of said opposite conductivity type having an emitter connected to said second bus bar, a collector connected through said coupling impedance to said first bus bar, and a base connected to the junction of said input impedance with said source, the collector of said input transistor being further connected to the base of said control transistor.

4. A power amplifier as defined in claim 3 wherein the characteristics of said transistors are such as to saturate said ancillary transistor before said input transistor in the presence of a signal from said source tending to drive said input transistor to saturation.

5. A power amplifier as defined in claim 3 wherein said coupling impedance comprises a pilot transistor of said one conductivity type in series with said input transistor.

6. A power amplifier as defined in claim 3 wherein said input impedance comprises the forward resistance of another diode.

7. A power amplifier as defined in claim 1 wherein said output impedance comprises a switching transistor.

8. A power amplifier as defined in claim 1 wherein said load circuit comprises a capacitor and a resistance in series therewith.

9. A power amplifier as defined in claim 1 wherein said first bus bar is more negative than said second bus bar, said control and output transistors being of NPN type, said ancillary transistor being of PNP type.

10. A power amplifier as defined in claim 1 wherein said transistors, said input circuitry and said output impedance are monolithically integrated.

* * * * *